(12) United States Patent
Tanuma et al.

(10) Patent No.: US 6,965,190 B2
(45) Date of Patent: Nov. 15, 2005

(54) SURFACE ACOUSTIC WAVE DEVICE

(75) Inventors: Toshio Tanuma, Toyonaka (JP); Kouichi Yoshioka, Joyo (JP); Tatsurou Usuki, Osaka (JP); Naoki Tanaka, Sakai (JP); Hideki Itou, Osaka (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 303 days.

(21) Appl. No.: 10/237,971

(22) Filed: Sep. 10, 2002

(65) Prior Publication Data

US 2003/0094883 A1 May 22, 2003

(30) Foreign Application Priority Data

Sep. 12, 2001 (JP) ........................................ 2001-277325

(51) Int. Cl.$^7$ .............................................. H01L 41/08
(52) U.S. Cl. ................... 310/363; 310/313 A; 310/364
(58) Field of Search ........................... 310/313 R, 363, 310/364, 313 A

(56) References Cited

U.S. PATENT DOCUMENTS

| | | | |
|---|---|---|---|
| 4,775,814 A | * 10/1988 | Yuhara et al. | .......... 310/313 R |
| 4,906,885 A | 3/1990 | Kojima et al. | |
| 4,942,327 A | 7/1990 | Watanabe et al. | |
| 5,773,917 A | * 6/1998 | Satoh et al. | ................ 310/364 |
| 5,844,347 A | * 12/1998 | Takayama et al. | ...... 310/313 R |
| 6,388,361 B1 | 5/2002 | Nishihara et al. | |
| 6,486,591 B2 | * 11/2002 | Nishihara | .................... 310/364 |
| 6,555,160 B1 | * 4/2003 | Clough | ........................ 427/217 |

FOREIGN PATENT DOCUMENTS

| | | |
|---|---|---|
| EP | 0 249 256 A2 | 12/1987 |
| EP | 0 524 754 A2 | 1/1993 |
| JP | 57-101413 | 6/1982 |
| JP | 61-47010 | 10/1986 |
| JP | 62-244150 | 10/1987 |
| JP | A-64-80113 | 3/1989 |
| JP | A-90268 | 4/1993 |
| JP | 5-90268 | 4/1993 |
| JP | 5-206776 | 8/1993 |
| JP | A-6-6173 | 1/1994 |
| JP | A-6-350377 | 12/1994 |
| JP | A-7-278852 | 10/1995 |
| JP | A-8-32404 | 2/1996 |
| JP | A-8-148966 | 6/1996 |
| JP | A-9-135143 | 5/1997 |
| JP | A-2001-119259 | 4/2001 |
| JP | A-2002-368568 | 12/2002 |

* cited by examiner

*Primary Examiner*—Mark Budd
(74) *Attorney, Agent, or Firm*—Armstrong, Kratz, Quintos, Hanson & Brooks, LLP

(57) ABSTRACT

A surface acoustic wave device including an electrode formed from an electrode material represented by the composition formula $M_xV_y$ wherein M is aluminum or an aluminum-copper alloy, V is vanadium, $x+y=100$ and $0.10 \leq y < 0.2$. The device is excellent in durability against applying electric power and diminished in internal resistance.

17 Claims, 5 Drawing Sheets

SURFACE ACOUSTIC WAVE DEVICE

BACKGROUND OF THE INVENTION

Field of the invention

The present invention relates to surface acoustic wave devices comprising electrodes formed on a piezoelectric substrate for exciting surface acoustic waves.

DESCRIPTION OF THE RELATED ART

Surface acoustic wave devices have heretofore been used in portable telephones and like communications devices as circuit elements of resonator filters and signal processing delay lines. For example, FIG. 8 shows a surface acoustic wave device which comprises a plurality of electrodes 52a, 52a arranged on the surface of a piezoelectric substrate 51 to provide a pair of interdigital electrodes 52, 52 thereon, and latticelike reflectors 53, 53 arranged on opposite sides of the pair of interdigital electrodes. A pair of input pads 54, 54 and a pair of output pads 55, 55, are connected to the respective interdigital electrodes 52, 52.

Communications devices have adapted for use at higher frequencies in recent years, which has made the frequencies and outputs of surface acoustic wave devices higher. The increases in operating frequencies entail the narrower width of the electrodes 52a. For example when the center frequency of operating frequencies is 1 GHz, the electrodes 52a have a width of 1 $\mu$m. When higher power is applied to a surface acoustic device having electrodes of such a small width, the amplitude of the surface acoustic wave standing on the surface of the piezoelectric substrate 51 becomes larger and this gives a great stress on the electrodes 52a. When this stress exceeds a critical stress inherent in the material of the electrode 52a, atoms in the electrode 52a migrate to the grain boundaries, forming voids or hillocks in the electrode 52a and consequently deteriorating the electrode 52a.

Accordingly, it is known to add dopants, such as copper, titanium or nickel, to aluminum serving as the electrode material to give an enhanced strength to the electrode and improve the durability thereof (JP-B 61-47010). The electrode is then improved in durability with an increase in the amount of the additive.

However, this method has the problem that the resistivity of the electrode increases with an increase in the amount of the additive to increase the internal loss of the surface acoustic wave device.

SUMMARY OF THE INVENTION

An object of the present invention is to provide a surface acoustic wave device which has electrodes of outstanding durability and which is nevertheless diminished in internal loss.

The present invention provides a surface acoustic wave device comprising an electrode made of a thin metal film and formed on a piezoelectric substrate, the electrode being made of an electrode material represented by the formula $M_xV_y$ wherein M is aluminum or an aluminum-copper alloy, V is vanadium, wherein x and y equal 100 wt. %, and y is at least 0.10 wt. % to not greater than 0.2 wt. %. Stated specifically, the electrode is made of an electrode material represented by the formula $M_xV_y$ wherein x and y equal 100 wt. %, and y is at least 0.15 wt. % to not greater than 0.2 wt. %. Further stated specifically, the electrode is made of an electrode material represented by the formula $M_xV_y$ wherein x and y equal 100 wt. %, and y is 0.15 wt. %.

With the surface acoustic wave device of the invention, the addition of vanadium gives the electrode improved durability and a prolonged life.

The present invention provides another surface acoustic wave device comprising an electrode made of a thin metal film and formed on a piezoelectric substrate, the electrode being made of the base material and dopants. The base material is aluminum or aluminum-copper alloy, and vanadium as referred to above. Dopants can reduce the resistivity of the base material through an annealing process. R1 which is the resistivity measured before annealing is larger than R2 which is the resistivity measured after annealing. Added vanadium can provide a superior durability and added dopants which reduce the resistivity of the base material after annealing can diminish the increased internal loss by doped vanadium. Moreover, the durability of the electrode improved by the addition of vanadium will not be impaired.

Stated more specifically, the dopants for reducing the resistivity of the base material by annealing is palladium or platinum. The electrode formed from the electrode material incorporating palladium or platinum therein is reduced in resistivity by annealing, whereby the increased internal loss of the surface acoustic wave device is ameliorated.

Further stated more specifically, the electrode is made of an electrode material represented by the formula $M_xV_yA_z$ wherein A is palladium or platinum, M is aluminum or an aluminum-copper alloy, V is vanadium, wherein x, y, and z equal 100 wt. %, y is at least 0.10 wt. % to not greater than 0.2 wt. %, and z is equal to or not greater than 2.0 wt. %. When the amount of palladium or platinum is up to 2 wt. %, it is possible to fabricate the electrode by reactive etching method.

Further stated more specifically, the electrode is made of an electrode material represented by the formula $M_xV_y A_z$ wherein x, y, and z equal 100 wt. %, y is at least 0.10 wt. % to not greater than 0.2 wt. %, and z is at least 0.1 wt. % to equal to or not greater than 0.3 wt. %. The electrode obtained is especially excellent in durability.

The present invention provides another surface acoustic wave device comprising an electrode made of a thin metal film and formed on a piezoelectric substrate. The electrode comprises an orientation control layer formed on a surface of the piezoelectric substrate, and an electrically conductive layer formed on a surface of the orientation control layer, the orientation control layer being formed from a material capable of improving the orientation of the conductive layer, the conductive layer being made of a material represented by the formula $M_xV_y$ wherein M is aluminum or an aluminum-copper alloy, V is vanadium, wherein x and y equal 100 wt. %, and y is at least 0.10 wt. % to not greater than 0.2 wt. %. With this surface acoustic wave device, the composition of the conductive layer gives improved durability to the electrode. With the conductive layer oriented by the orientation control layer, the conductive layer is given an improved strength, and the area of grain boundaries between the crystal grains forming the conductive layer is reduced, giving outstanding durability to the electrode.

Stated more specifically, orientation control layers and conductive layers are alternately superposed on the surface of the piezoelectric substrate. With the orientation control layer interposed between two conductive layers in this specific construction, the voids or hillocks created in one conductive layer are prevented from enlarging by the orientation control layer, consequently exerting no influence on the other conductive layer. As a result, the voids or hillocks produced in one conductive layer merely destroy this conductive layer, permitting the other conductive layers to maintain the function of the electrode. Furthermore, improved orientation diminishes the area of grain boundaries between the crystal grains, inhibiting diffusion of aluminum atoms which directly causes the destruction of the conductive layer and affording improved durability against electric power.

Further stated more specifically, the orientation control layer is made of titanium. With this specific construction, the lattice constant of titanium is approximately the same as that of aluminum or aluminum-copper alloy, hence the lattices are in good conformity. The conductive layer of aluminum or aluminum-copper alloy can therefore be further improved in orientation.

According to another specific construction, the orientation control layer is at least 15 nm to not larger than 20 nm in thickness. Since the orientation control layer then has satisfactory orientation, the conductive layer is also oriented satisfactorily and is thereby given an improved strength. The improved orientation reduces the area of grain boundaries between the crystal grains.

Stated more specifically, the orientation control layer is 17 nm in thickness. The thin orientation control layer is unlikely to give an increased resistivity to the electrode.

The present invention further provides another surface acoustic wave device comprising an electrode made of a thin metal film and formed on a piezoelectric substrate. The electrode comprising an orientation control layer formed on a surface of the piezoelectric substrate, and an electrically conductive layer formed on a surface of the orientation control layer, the orientation control layer being formed from a material capable of improving the orientation of the conductive layer, the conductive layer being made of an electrode material represented by the formula $M_xV_yA_z$ wherein M is aluminum or an aluminum-copper alloy, V is vanadium, A is palladium or platinum, wherein x, y, and z equal 100 wt. %, y is at least 0.10 wt. % to not greater than 0.2 wt. %, and z is equal to or not greater than 2.0 wt. %. The composition of the conductive layer gives improved durability to the electrode, while the increase in internal loss is very small. Since the conductive layer is oriented by the orientation control layer, the conductive layer is given an improved strength, and the area of grain boundaries is reduced, giving outstanding durability to the electrode.

Thus, the invention provides a surface acoustic wave device wherein the electrode has high durability and which is minimized in the increase of internal loss.

DETAILED DESCRIPTION OF EMBODIMENTS

Embodiments of the present invention will be described below with reference to the drawings.

[First Embodiment]

Figure 8:
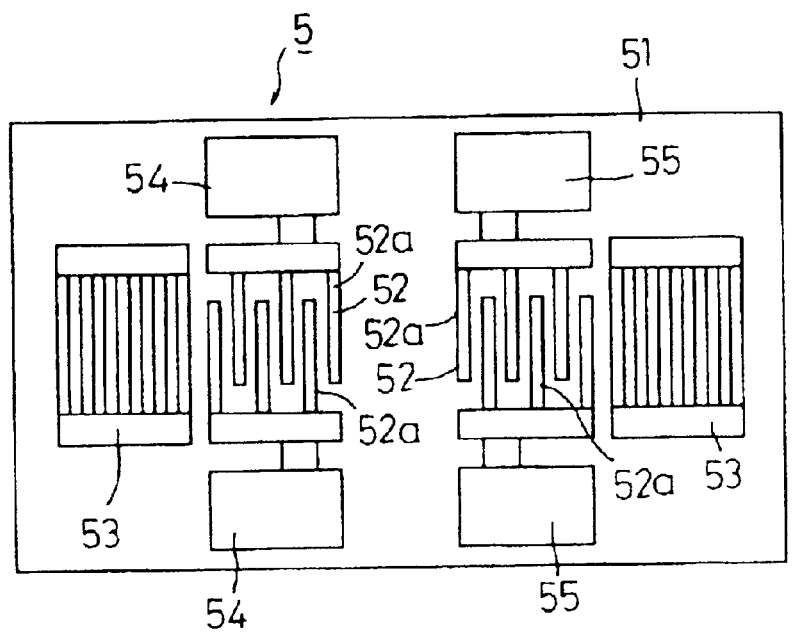
FIG. 8 is a plan view of a conventional surface acoustic wave device.

Like the conventional surface acoustic wave device shown in FIG. 8, the surface acoustic wave device of this embodiment comprises a plurality of electrodes arranged on the surface of a piezoelectric substrate to provide a pair of interdigital electrodes thereon. Latticelike reflectors are arranged on opposite sides of the pair of interdigital electrodes. A pair of input pads and a pair of output pads are connected to the respective interdigital electrodes. Each of the electrodes is made of an aluminum alloy represented by the formula $Al_xV_y$, wherein x and y equal 100 wt. %, y is 0.15 wt. %.

The device is fabricated by the following process. First, an alloy film having a thickness of 450 nm is formed on the surface of a wafer of lithium tantalate ($LiTaO_3$) by RF magnetron sputtering. The wafer is withdrawn from the apparatus, and then subjected to photolithography for patterning to form a pair of interdigital electrodes, reflectors, input pads and output pads. The pair of interdigital electrodes, reflectors, input pads and output pads are in the form of a predetermined pattern for providing one surface acoustic wave device, and a plurality of patterns are formed on the wafer. Finally, the wafer is cut into individual patterns, which are annealed at 200° C. for 1 hour, whereby surface acoustic wave devices of the invention are obtained.

[Second Embodiment]

The surface acoustic wave device of this embodiment has the same construction as the device of the first embodiment. However, each of the electrodes is formed from an aluminum alloy represented by the formula $Al_xV_yPd_z$ wherein x, y, and z equal 100 wt. %, y is 0.15 wt. %, and z is 0.2 wt. %. The device is fabricated by the same process as the first embodiment, so that the process will not be described again.

[Third Embodiment]

Figure 6:
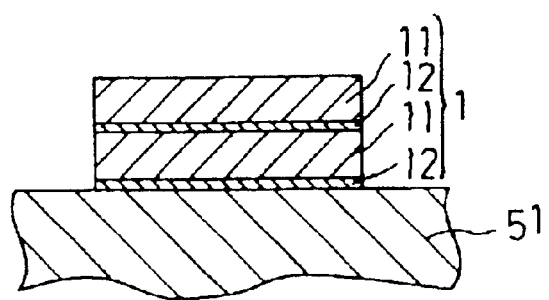
FIG. 6 is a view showing an electrode of a surface acoustic wave device of the invention in section along the direction of thickness thereof.

The surface acoustic wave device of this embodiment has the same shape as the device of the first embodiment. However, the electrode 1 of the device comprises four layers which are superposed along the direction of thickness of the electrode as seen in FIG. 6. An orientation control layer 12 of titanium is formed on the surface of a piezoelectric substrate 51, and an electrically conductive layer 11 is formed from an aluminum alloy represented by the composition formula $Al_xV_yPd_z$ wherein x, y, and z equal 100 wt. %, y is 0.15 wt. %, and z is 0.2 wt. % on the surface of the layer 12. An orientation control layer 12 is further formed on the surface of the conductive layer 11, with another conductive layer 11 provided on the layer 12.

The surface acoustic wave device is fabricated by the following process. First, an orientation control layer having a thickness of 17 nm is formed on the surface of a wafer of lithium tantalate ($LiTaO_3$) by RF magnetron sputtering. Next, an electrically conductive layer having a thickness of 190 nm is formed on the surface of the orientation control layer by RF magnetron sputtering. Another orientation control layer is formed on the surface of the conductive layer, and another conductive layer is formed on the orientation control layer to provide a metal film having a four-layer structure. The film is thereafter subjected to the same steps of patterning, cutting and annealing as performed for the first embodiment, so that these steps will not be described again.

As will be apparent from the experimental results to be described later, the electrodes of the surface acoustic wave devices of the invention are outstanding in durability and diminished in internal loss. The devices are therefore excellent in durability and reduced in internal loss.

Described below are the experiments conducted for the electrodes of surface acoustic wave devices of the invention and results thereof.

[Experiment 1]
Durability Test for Electrodes of Al—V Alloy

The surface acoustic wave devices used for the experiment were each fabricated in the same manner as the first embodiment described, by forming a 500-nm-thick film of aluminum-vanadium alloy on the surface of a piezoelectric substrate of lithium tantalate (LiTaO$_3$) to provide a pair of interdigital electrodes, reflectors, input pads and output pads on the substrate. Annealing was conducted at 200° C. C for 1 hour. Table 1 shows six electrode compositions used. The device was tested for durability by continuously applying electric power of 1.2 W to the device in an atmosphere of 85° C. and measuring the time elapsed until the electrode became deformed or degraded. Table 1 and FIG. 1 show the durability test result.

TABLE 1

| Electrode composition | Durability (hrs.) |
| --- | --- |
| Al only | 0.2 |
| Al-0.05 wt % V | 0.5 |
| Al-0.1 wt % V | 10 |
| Al-0.15 wt % V | 90 |
| Al-0.2 wt % V | 100 |
| Al-0.3 wt % V | 150 |

Figure 1:
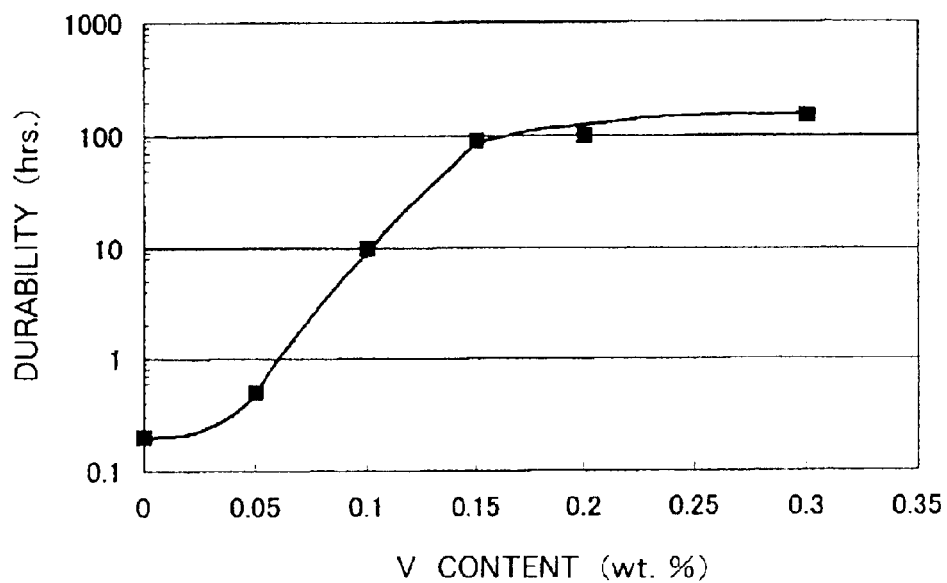
FIG. 1 is a graph showing the result of Experiment 1.

The result shown in Table 1 and FIG. 1 reveals that the electrodes exhibited remarkably improved durability when the amount of vanadium added was in excess of 0.05 wt. %. This is thought attributable to the following. The addition of vanadium in excess of 0.05 wt. % greatly increased the likelihood of vanadium straining the aluminum lattice therearound to thereby impede the migration of aluminum atoms within the crystal grains, consequently inhibiting formation of voids or hillocks inside the electrode.

[Experiment 2]
Measurement of Resistivity of Thin Films of Al-1 wt. % Cu—V Alloy Used for the experiment were 500-nm-thick thin films each formed on the surface of a 36-degree rotated Y-axis cut LiTaO$_3$ substrate by magnetron sputtering. The thin films were annealed and thereafter checked for resistivity. Table 2 shows four thin film compositions used. Annealing was conducted at 200° C. for 2 hours. Table 2 and FIG. 2 show the resistivity measurements.

TABLE 2

| Film composition | Resistivity ($\mu$ Ω cm) | Life (hrs.) |
| --- | --- | --- |
| Al-1 wt % Cu-0.05 wt % V | 4.95 | 5.10 |
| Al-1 wt % Cu-0.1 wt % V | 4.98 | 7.19 |
| Al-1 wt % Cu-0.15 wt % V | 5.06 | 12.34 |
| Al-1 wt % Cu-0.2 wt % V | 5.30 | 14.36 |

Figure 2:
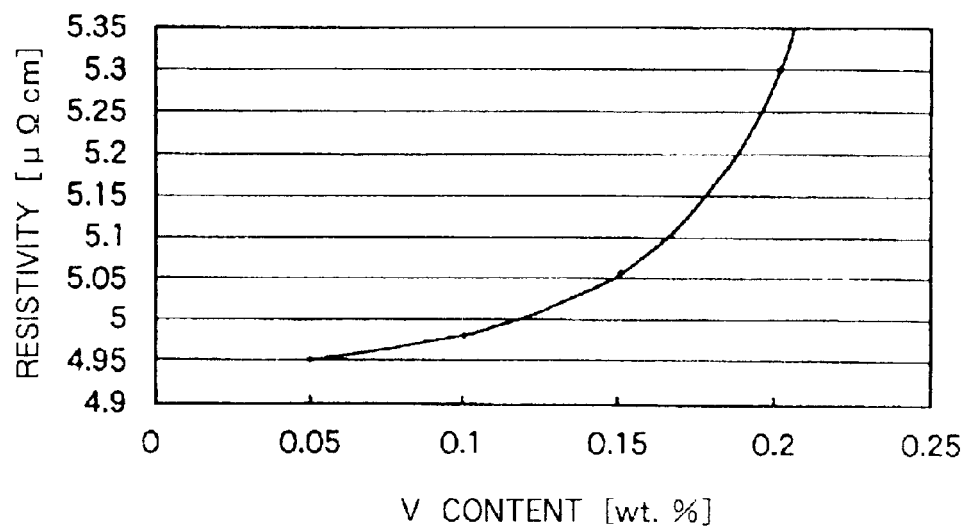
FIG. 2 is a graph showing the result of Experiment 2.

Table 2 and FIG. 2 reveal that the resistivity of the electrode increased markedly when the amount of vanadium added was not smaller than 0.2 wt. %. This appears attributable to the following. The average distance between the vanadium atoms in the electrode is made approximate to the electron wavelength by increasing the vanadium content to about 0.2 wt. %, consequently increasing the probability of electron waves scattering. The results of Experiments 1 and 2 substantiate that the effect to improve the durability and the effect to lower the resistivity are available at the same time when the vanadium content is at least 0.10 wt. % to less than 0.2 wt. %. The experimental results further indicate that the vanadium content is preferably at least 0.15 wt. % to less than 0.2 wt. %, more preferably 0.15 wt. %.

[Experiment 3]
Measurement of Resistivity of Thin Film of Al-0.2 wt. % V-1 wt. % Pd Alloy Used for the experiment was a thin film formed on the surface of a 36-degree rotated Y-axis cut LiTaO$_3$ substrate by magnetron sputtering. The thin film was checked for resistivity before and after annealing. Annealing was conducted at 200° C. for 2 hours. The film was 500 nm in thickness. Table 3 and FIG. 3 show the resistivity measurements.

TABLE 3

| Electrode composition | Resistivity ($\mu$ Ω cm) Before annealing | Resistivity ($\mu$ Ω cm) After annealing |
| --- | --- | --- |
| Al-0.2 wt % V-1 wt % Pd | 5.8 | 4.9 |

Figure 3:
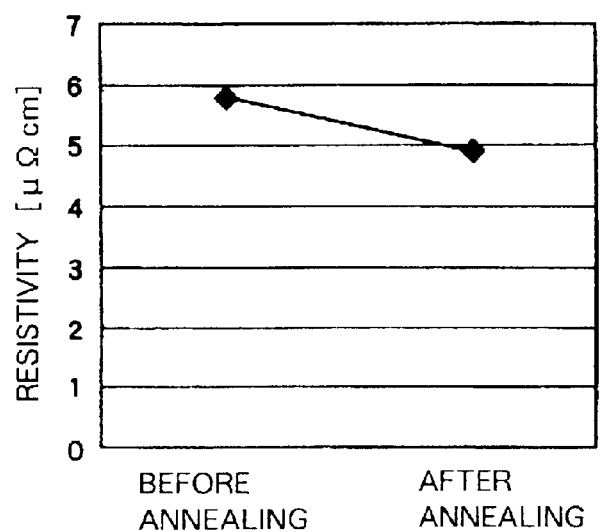
FIG. 3 is a graph showing the result of Experiment 3.

Table 3 and FIG. 3 reveal that the resistivity of the aluminum-vanadium-palladium alloy is smaller after annealing than before annealing. Palladium is dopant reducing the resistivity of the aluminum-vanadium alloy by annealing. The reduction in resistivity appears attributable to the following. Although it is difficult to produce an alloy from aluminum and vanadium by annealing at about 200° C., palladium and vanadium can be made into an alloy by the annealing process at the temperature described above, producing minute segregated particles. Then the amount of vanadium dissolved in aluminum decreases resulting in lower resistivity.

When a similar experiment was conducted using ruthenium, silver, gold or platinum in place of palladium, the addition of ruthenium, silver or gold failed to give a reduced resistivity, whereas the addition of platinum resulted in a lower resistivity after annealing. Accordingly presence of platinum is similarly effective.

[Experiment 4]
Durability Test for Electrodes of Al—V—Pd Alloy

The surface acoustic wave devices used for the experiment were each fabricated in the same manner as the second embodiment described, by forming a 500-nm-thick film of aluminum-vanadium-palladium alloy on the surface of a piezoelectric substrate of lithium tantalate (LiTaO$_3$) to provide a pair of interdigital electrodes, reflectors, input pads and output pads on the substrate. Annealing was conducted at 200° C. for 1 hour. Table 4 shows five electrode compositions used. The device was tested for durability by continuously applying electric power of 1.2 W to the device in an atmosphere of 85° C. and measuring the time elapsed until the electrode became deformed or degraded. Table 4 and FIG. 4 show the durability test result.

TABLE 4

| Electrode composition | Durability (hrs.) |
| --- | --- |
| Al-0.15 wt % V | 90 |
| Al-0.15 wt % V-0.1 wt % Pd | 100 |
| Al-0.15 wt % V-0.2 wt % Pd | 120 |
| Al-0.15 wt % V-0.3 wt % Pd | 100 |
| Al-0.15 wt % V-0.4 wt % Pd | 80 |

Figure 4:
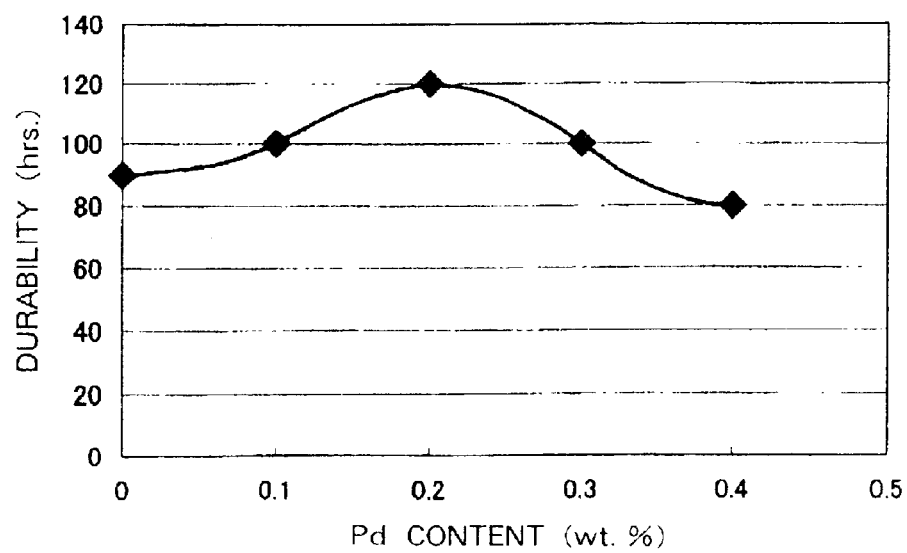
FIG. 4 is a graph showing the result of Experiment 4.

The result shown in Table 4 and FIG. 4 reveals that the electrodes exhibited remarkably improved durability when the amount of palladium added was at least 0.1 wt. % to not greater than 0.3 wt. %. The result indicates that the amount of palladium to be added is preferably at least 0.1 wt. % to not greater than 0.3 wt. %.

[Experiment 5]
Durability Test of Surface Acoustic Wave Devices

Figure 5:
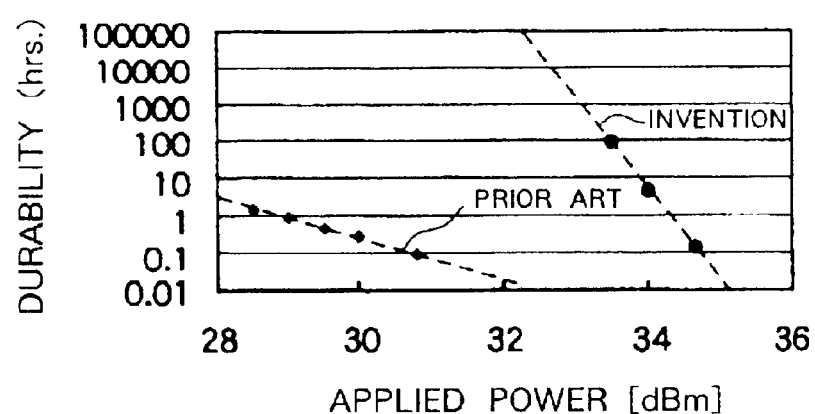
FIG. 5 is a graph showing the result of Experiment 5.
Figure 9:
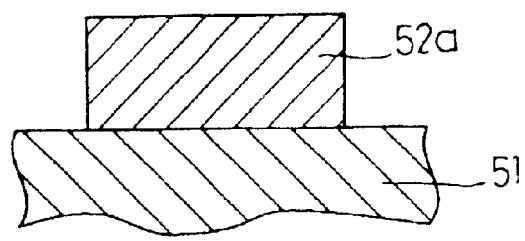
FIG. 9 is a view showing an electrode of the surface acoustic wave device in section along the direction of thickness thereof.

Used for the experiment were the surface acoustic wave device of the third embodiment and a conventional surface acoustic wave device. The electrodes of the third embodiment had a four-layer structure as shown in FIG. 6, while the conventional electrodes had a single-layer structure as shown in FIG. 9. The conductive layers of the electrodes of the third embodiment had the composition of $Al_a Cu_b V_c Pd_d$ wherein a+b+c+d=100, b=1, c=0.5 and d=0.2. The conventional electrodes had the composition of $Al_a Cu_b$ wherein a+b=100 and b=1. The durability test was conducted in an atmosphere of 85 by applying electric power of a high frequency which was 12.5 MHz higher than the center frequency of each surface acoustic wave device to measure the time taken for the internal loss value immediately after the application of voltage to increase by 0.5 dB. FIG. 5 shows the durability test result.

The result given in FIG. 5 shows that the electrode of the surface acoustic wave device of the third embodiment is more durable than the electrode of the conventional device. The reason is that since the conductive layer is formed on the surface of the orientation control layer of titanium, the aluminum atoms in the conductive layer are oriented to give an enhanced strength to the conductive layer and reduce the area of grain boundaries between the crystal grains. Another reason is that the composition of the conductive layer of the electrode contains 0.2 wt. % of palladium.

As described above, the electrodes of surface acoustic wave devices of the present invention are fabricated from a material comprising aluminum or an aluminum-copper alloy serving as a base, and vanadium, or vanadium and palladium added to the base. Given below is the reason why vanadium and palladium are used as the elements to be added.

First, Ti, Pd, Nb, Ni, Co, Li, Cr, Hf, Zr, Cd, W, V, Mn, Fe and Ru were selected as possible addition elements.

Among these, Co, Mn, Fe or Ni, when used for addition, poses a problem in the workability of the material; for example, the element leaves a residue when the material is worked on by reactive etching. Li or Fe, if used, permits the electrode to develop a defect in its surface due to corrosion after the step of washing with water, hence the problem in corrosion resistance. Co, Cr and Cd present environmental problems. As a result, Ti, Pd, Nb, Hf, Zr, W, V and Ru remained as possible elements (see Table 5).

Next, each of these elements remaining for possible use was added only in an amount of 0.1 wt. % to an Al-1 wt. % Cu base, and the alloy obtained was checked for durability against electric power, relative to the base alloy. Table 5 shows the result, which indicates that vanadium is highly excellent for use as the element to be added from the viewpoint of durability against electric power.

Furthermore, the elements remaining for possible use were checked for the rate of increase of resistance relative to the amount (at. %) of the element added. Table 5 shows the result, which indicates that vanadium is high in the rate of increase of resistance.

TABLE 5

| | RIE workability | Corrosion resistance | Acceptability to environment | Rate of increase of resistance | Durability against power |
|---|---|---|---|---|---|
| V | ○ | ○ | ○ | 5.97 | 11.3 |
| Pd | ○ | ○ | ○ | 1.63 | 2.4 |
| Nb | ○ | ○ | ○ | 2.27 | 1.3 |
| Ni | X | ○ | ○ | — | — |
| Co | X | Δ | X | — | — |
| Li | Δ | X | ○ | — | — |
| Cr | Δ | Δ | X | 5.04 | 3.2 |
| Hf | Δ | ○ | ○ | 1.81 | 1.3 |
| Zr | ○ | ○ | ○ | 0.34 | 5.70 |
| Cd | ○ | Δ | X | — | — |
| W | ○ | ○ | ○ | 2.03 | 5.8 |
| Ti | ○ | ○ | ○ | 2.09 | 6.2 |
| Mn | X | Δ | ○ | — | — |
| Ru | ○ | ○ | ○ | 4.66 | 9.7 |
| Fe | X | X | ○ | — | — |

Accordingly, an attempt was made to ensure improved durability against electric power first by using a material comprising aluminum or an aluminum-copper alloy serving as a base, and vanadium added to the base, for the fabrication of the electrodes of the surface acoustic wave device of the invention. Next, when testing the co-doping of vanadium and palladium to the base and annealing, it was found by accident that palladium can compensate for the drawback of the vanadium that this element is high in the rate of increase of resistivity. Thus finally prepared was a material which comprises aluminum or an aluminum-copper alloy as a base, and vanadium and palladium added to the base and which fulfills both the requirements of improved durability to electric power and reduced resistance.

Furthermore, an alloy prepared by adding vanadium to an aluminum-copper alloy and an alloy corresponding to this alloy in which the vanadium was replaced by scandium were checked for resistivity and for service life with the application of electric power of 2.5 W. Table 6 shows the result.

TABLE 6

| | Resistivity ($\mu \Omega$ cm) | Life (hrs.) |
|---|---|---|
| Al 0.15 wt. % V 1 wt. % Cu | 5.06 | 12.34 |
| Al 2 wt. % Cu | 4.1 | 9.89 |
| Al 0.15 wt. % Sc 1 wt. % Cu | 4.53 | 5.31 |

The result also indicates the superiority of vanadium as the element to be added.

Figure 7:
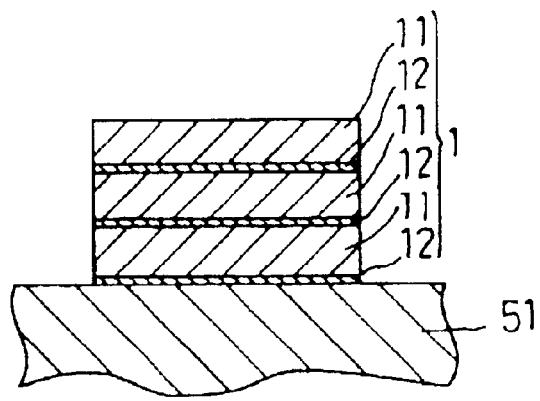
FIG. 7 is a view showing an electrode of another surface acoustic wave device of the invention in section along the direction of thickness thereof.

The device of the present invention is not limited to the foregoing embodiments in construction but can be modified variously by one skilled in the art without departing from the spirit of the invention as set forth in the appended claims. For example, an aluminum-1 wt. % Copper alloy is usable in place of aluminum in the embodiments described. The same advantages as available by the embodiments can be obtained also in this case. Although the electrodes of the third embodiment has a four-layer structure, the number of layers to be superposed is not limited to four but can be any desired number. For example, a six-layer structure shown in FIG. 7 is useful.

What is claimed is:
1. A surface acoustic wave device comprising an electrode made of a thin metal film and formed on a piezoelectric substrate, the electrode being made of an electrode material represented by the formula $M_x V_y$ wherein M is aluminum or an aluminum-copper alloy, and V is vanadium, wherein x and y equal 100 wt. % and y is at least 0.10 wt. % to not greater than 0.2 wt. %.

2. A surface acoustic wave device according to claim 1 wherein the electrode is made of an electrode material represented by the formula $M_xV_y$ wherein x and y equal 100 wt. % and y is at least 0.15 wt. % to not greater than 0.2 wt. %.

3. A surface acoustic wave device according to claim 1 wherein the electrode is made of an electrode material represented by the formula $M_xV_y$ wherein x and y equal 100 wt. % and y is 0.15 wt. %.

4. A surface acoustic wave device comprising an electrode made of a thin metal film and formed on a piezoelectric substrate, the electrode being formed from an electrode material comprising a base material composed of aluminum or an aluminum-copper alloy, and vanadium, and dopants added to the base material for reducing the resistivity of the base material by annealing, the electrode being annealed, the electrode having the relationship of R1>R2 wherein R1 is the resistivity of the electrode before annealing, and R2 is the resistivity of the electrode after annealing.

5. A surface acoustic wave device according to claim 4, wherein the dopants for reducing the resistivity of the base material by annealing is palladium or platinum.

6. A surface acoustic wave device according to claim 5, wherein the electrode is made of an electrode material represented by the formula $M_xV_yA_z$ wherein A is palladium or platinum, M is aluminum or an aluminum-copper alloy, and V is vanadium, wherein x, y and z equal 100 wt. %, y is at least 0.10 wt. % to not greater than 0.2 wt. %, and z is equal to or not greater than 2.0 wt. %.

7. A surface acoustic wave device according to claim 6, wherein the electrode is formed from an electrode material represented by the composition formula $M_xV_yA_z$ wherein x, y and z equal 100 wt. %, y is at least 0.10 to not greater than 0.2, and z is at least 0.1 to equal to or not greater than 0.3.

8. A surface acoustic wave device comprising an electrode made of a thin metal film and formed on a piezoelectric substrate, the electrode comprising an orientation control layer formed on a surface of the piezoelectric substrate, and an electrically conductive layer formed on a surface of the orientation control layer, the orientation control layer being formed from a material capable of improving the orientation of the conductive layer, the conductive layer being made of a material represented by the formula $M_xV_y$ wherein M is aluminum or an aluminum-copper alloy, V is vanadium, wherein x and y equal 100 wt. %, and y is at least 0.10 wt. % to not greater than 0.2 wt. %.

9. A surface acoustic wave device according to claim 8 wherein orientation control layers and conductive layers are alternately superposed on the surface of the piezoelectric substrate.

10. A surface acoustic wave device according to claim 8 wherein the orientation control layer is formed from titanium.

11. A surface acoustic wave device according to claim 8 wherein the orientation control layer is at least 15 nm to not larger than 20 nm in thickness.

12. A surface acoustic wave device according to claim 11 wherein the orientation control layer is 17 nm in thickness.

13. A surface acoustic wave device comprising an electrode made of a thin metal film and formed on a piezoelectric substrate, the electrode comprising an orientation control layer formed on a surface of the piezoelectric substrate, and an electrically conductive layer formed on a surface of the orientation control layer, the orientation control layer being formed from a material capable of improving the orientation of the conductive layer, the conductive layer being formed from a material represented by the formula $M_xV_yA_z$ wherein M is aluminum or an aluminum-copper alloy, V is vanadium, A is palladium or platinum, wherein x, y, and z equal 100 wt. %, y is at least 0.10 wt. % to not greater than 0.2 wt. %, and z is equal to or not greater than 2.0 wt. %.

14. A surface acoustic wave device according to claim 13, wherein orientation control layers and conductive layers are alternately superposed on the surface of the piezoelectric substrate.

15. A surface acoustic wave device according to claim 13, wherein the orientation control layer is formed from titanium.

16. A surface acoustic wave device according to claim 13, wherein the orientation control layer has a thickness at least 15nm and not greater than 20nm.

17. A surface acoustic wave device according to claim 16, wherein the orientation control layer has a thickness of 17 nm.

* * * * *

UNITED STATES PATENT AND TRADEMARK OFFICE
CERTIFICATE OF CORRECTION

| | |
|---|---|
| PATENT NO. | : 6,965,190 B2 |
| APPLICATION NO. | : 10/237971 |
| DATED | : November 15, 2005 |
| INVENTOR(S) | : Tanuma et al. |

Page 1 of 1

It is certified that error appears in the above-identified patent and that said Letters Patent is hereby corrected as shown below:

In the Claims:

Col. 8, Line 64 - Col. 9, Line 12, Claims 1-3 should be deleted

Col. 9, Line 38 - Col. 10, Line 16, claims 8-12 should be deleted

Signed and Sealed this

Twenty-ninth Day of August, 2006

JON W. DUDAS
*Director of the United States Patent and Trademark Office*